(12) United States Patent
Inagawa et al.

(10) Patent No.: US 7,815,782 B2
(45) Date of Patent: Oct. 19, 2010

(54) PVD TARGET

(75) Inventors: Makoto Inagawa, Palo Alto, CA (US); Bradley O. Stimson, Monte Sereno, CA (US); Akihiro Hosokawa, Cupertino, CA (US); Hienminh Huu Le, San Jose, CA (US); Jrjyan Jerry Chen, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 1066 days.

(21) Appl. No.: 11/426,271

(22) Filed: Jun. 23, 2006

(65) Prior Publication Data
US 2007/0295596 A1    Dec. 27, 2007

(51) Int. Cl.
    C23C 14/35    (2006.01)
(52) U.S. Cl. .................. 204/298.26; 204/298.08; 204/298.11; 204/298.12; 204/298.19; 204/298.2
(58) Field of Classification Search ............ 204/298.09, 204/298.12, 298.13, 298.19, 298.2, 298.26, 204/298.08, 298.11
See application file for complete search history.

(56) References Cited

U.S. PATENT DOCUMENTS

| | | | | |
|---|---|---|---|---|
| 3,985,635 A | * | 10/1976 | Adam et al. | 204/298.11 |
| 5,433,835 A | * | 7/1995 | Demaray et al. | 204/298.09 |
| 5,487,822 A | | 1/1996 | Demaray et al. | |
| 5,518,593 A | * | 5/1996 | Hosokawa et al. | 204/192.12 |
| 5,593,082 A | * | 1/1997 | Ivanov et al. | 228/122.1 |
| 5,603,816 A | | 2/1997 | Demaray et al. | |
| 5,833,815 A | | 11/1998 | Kim et al. | |
| 6,093,293 A | * | 7/2000 | Haag et al. | 204/298.12 |
| 6,159,350 A | * | 12/2000 | Yoshimura et al. | 204/298.11 |
| 6,340,415 B1 | * | 1/2002 | Raaijmakers et al. | 204/192.12 |
| 6,344,117 B2 | | 2/2002 | Enomoto et al. | |
| 6,910,616 B2 | | 6/2005 | Halley et al. | |
| 7,101,466 B2 | | 9/2006 | Gupta et al. | |
| 7,588,669 B2 | * | 9/2009 | Guo | 204/298.2 |
| 2003/0168494 A1 | | 9/2003 | Halley et al. | |
| 2004/0004108 A1 | | 1/2004 | Halley et al. | |
| 2004/0094604 A1 | | 5/2004 | Halley et al. | |

FOREIGN PATENT DOCUMENTS

EP    1 067 209 A1 *  6/2000

(Continued)

OTHER PUBLICATIONS

English Translation of Korean Office Action dated Jun. 23, 2008.

(Continued)

Primary Examiner—Rodney G McDonald
(74) Attorney, Agent, or Firm—Patterson & Sheridan, LLP

(57) ABSTRACT

A physical vapor deposition target assembly is configured to isolate a target-bonding layer from a processing region. In one embodiment, the target assembly comprises a backing plate, a target having a first surface and a second surface, and a bonding layer disposed between the backing plate and the second surface. The first surface of the target is in fluid contact with a processing region and the second surface of the target is oriented toward the backing plate. The target assembly may include multiple targets.

4 Claims, 6 Drawing Sheets

FOREIGN PATENT DOCUMENTS

| | | | |
|---|---|---|---|
| JP | 2001-240964 | * | 9/2001 |
| KR | 2001-0075630 | | 9/2001 |

OTHER PUBLICATIONS

Notification of the First Office Action for Chinese Patent Application No. 2007101230335 dated Apr. 24, 2009.

Office Action dated May 19, 2009 for U.S. Appl. No. 11/483,134.

Notification of Second Office Action for Chinese Patent Application No. 200710123033.5 dated Nov. 6, 2009.

Notification of Third Office Action for Chinese Patent Application No. 200710123033.5 dated Mar. 9, 2010.

* cited by examiner

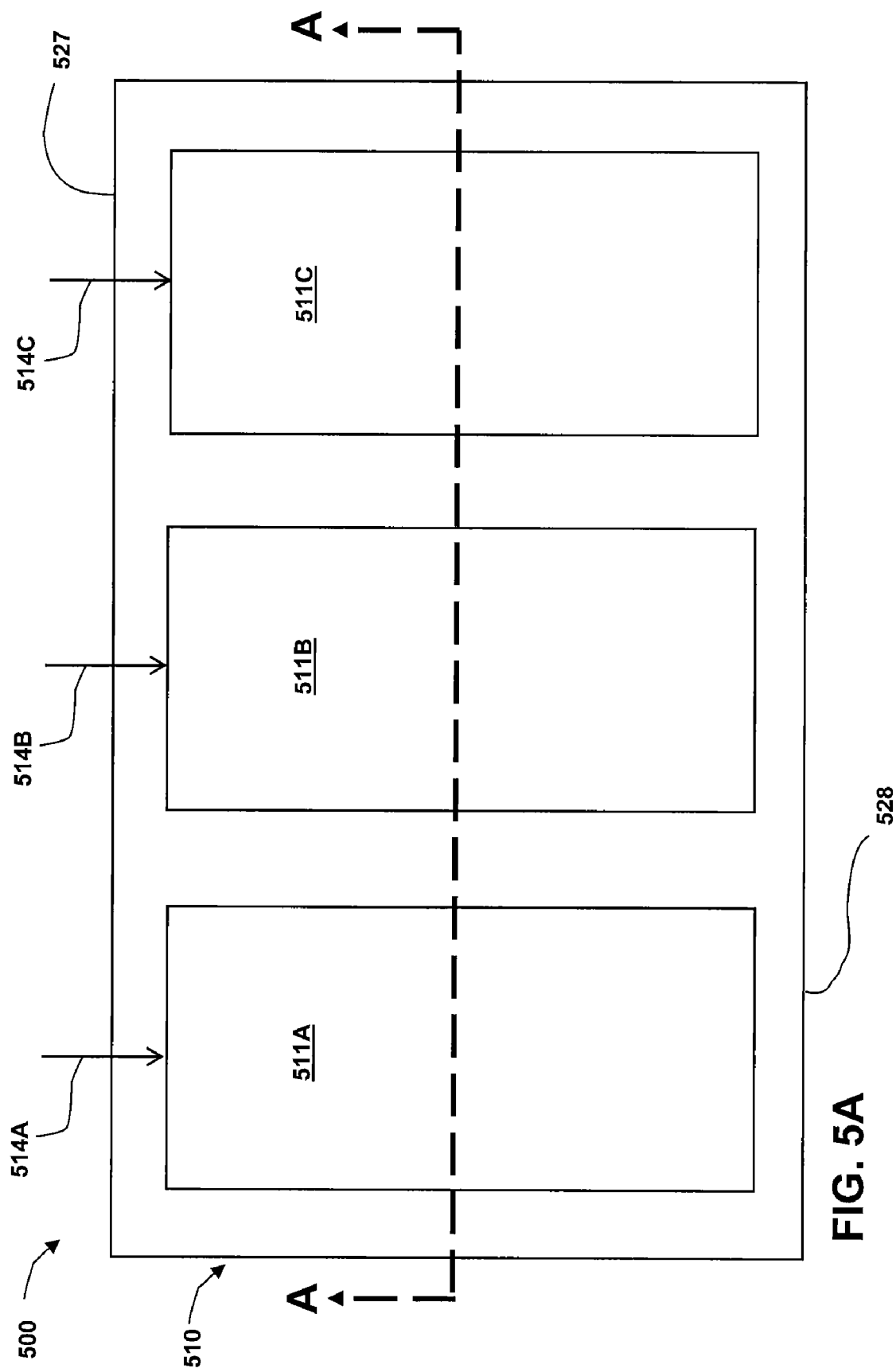

PVD TARGET

BACKGROUND OF THE INVENTION

1. Field of the Invention

Embodiments of the present invention generally relate to an apparatus and method for physical vapor deposition (PVD) and particularly to an improved PVD target and method of operating the same.

2. Description of the Related Art

The manufacture of flat panel displays, solar panels, and semiconductor devices relies on methods for the deposition of metallic and non-metallic thin films on a substrate. PVD is one such method.

PVD is generally performed in a high vacuum chamber and typically involves a magnetron sputtering process. Sputtering is performed by placing a target above the substrate, introducing a gas, such as argon, between the target and the substrate, and exciting the gas with a high-voltage DC signal to create ions that strike the target. The target consists of a material that is to be deposited as a thin film on the substrate. As the target is bombarded by ions, target atoms are dislodged and become deposited onto the substrate. The dislodged target atoms generally have substantial kinetic energy and when they impact the substrate the atoms tend to strongly adhere to the substrate. Magnetron sputtering further involves the placement of rotating or linearly translating magnets or magnet assemblies adapted to increase the plasma density in the PVD chamber and, hence, the deposition rate of the target material onto the substrate.

In some applications, e.g., the processing of large-area substrates, the PVD target is mounted onto a backing plate, for example to enhance the structural rigidity of the target. PVD target assemblies adapted to process large-area substrates are significantly different in design from target assemblies adapted to process 200 mm and 300 mm silicon wafers, due to factors related to substrate size. For example, target bowing, deposition uniformity, and thermal issues are considerations related to processing large-area substrates. As used herein, the term "large-area substrates" refers to substrates with a surface area, or "footprint" of about 1,000,000 mm$^2$ and larger and/or having one side that is at least 1 meter in length. The term "footprint", as used herein, refers to the nominal surface area of a substrate or target and not to the wetted surface area, i.e., the total surface area of all sides and surfaces combined. For example, a 1,000 mm×1,000 mm target has a nominal size of 1,000,000 mm$^2$, but a substantially higher wetted surface area, which includes the top and bottom surfaces and side edges.

The target is typically mounted to the backing plate via a bonding layer disposed therebetween, such as an adhesive elastomeric layer or a layer of solder. Issues associated with using a bonding layer to mount a PVD target to a backing plate include exposure of sensitive regions of the interior of the chamber to unwanted contamination, the presence of arc-inducing features related to the bonding layer, and poor electrical conductivity of the bonding layer affecting flow of electrical energy to the target.

FIG. 1 illustrates a conventional PVD chamber 100 in a schematic cross-sectional view. PVD chamber 100 includes a target assembly 110, a chamber body 120, a substrate support 130, a shield 140, a magnet assembly 150 and a processing region 160.

Target assembly 110 includes a target 111, which is bonded to a backing plate 112 by a bonding layer 113. A DC power connection 114 is electrically coupled to backing plate 112. Bonding layer 113 bonds target 111 to backing plate 112 and provides an electrically conductive path therebetween, allowing target 111 to be energized through backing plate 112 during the PVD process. Bonding layer 113 may be an elastomeric bond or a solder bond.

Substrate support 130 positions a substrate 131 adjacent the processing region 160 of PVD chamber 100 during PVD processing. Shield 140, also referred to as a dark space shield, is positioned inside PVD chamber 100 and proximate target sidewall 115 to protect the inner surfaces of body 120 and target sidewall 115 from unwanted deposition. Shield 140 is positioned very close to target sidewall 115 to minimize re-sputtered material from being deposited thereon. In addition, shield 140 is generally grounded electrically. Because of this, arcing between target 111, which is at a high voltage, i.e., approximately 300 to 500 V, and shield 140 can easily occur. Arcing is more likely to occur when any sharp point is present on the surface of target sidewall 115, since the charge density of an electric field proximate a charged conductor, i.e., the intensity of the electric field, is much higher near a sharp point on the charged conductor. Arcing is to be avoided at all times in a PVD chamber due to the large number of substrate-contaminating particles generated thereby as well as the potential for damaging conductive pathways already formed on a substrate.

FIG. 2A is a partial cross-sectional view of the region indicated in FIG. 1 of PVD chamber 100. In the example shown, bonding layer 113 is an elastomeric bonding layer, which may be used for mounting target 111 to backing plate 112. The inventors have discovered one problem with using an elastomeric material for bonding layer 113, namely the presence of voids 117, 118 that are typically inside bonding layer 113. When PVD chamber 100 is pumped down to vacuum, voids 117, 118, which contain air and/or other gases at atmospheric pressure, may burst into PVD chamber 100, contaminating both the processing region 160 and surfaces exposed thereto, including target sidewall 115, shield face 141, and substrate 131. Void bursting may take place during the initial pump-down of PVD chamber 100 or, due to the thermal cycling of target assembly 110 associated with processing substrates, throughout the life of target assembly 110.

Contamination of processing region 160 during PVD processing of a substrate may deleteriously affect the substrate by damaging devices formed thereon or by encouraging subsequent delamination of the PVD-deposited layer from the substrate. In addition, contamination of other surfaces in PVD chamber 100 may result in contamination of many substrates over the life of target assembly 110. This longer-term contamination problem is caused by particles of PVD-deposited material flaking off of shield face 141 and target sidewall 115 when a layer of bonding layer contaminants are present thereon.

During the PVD process, any surfaces in line-of-sight of the target face 119 of target 111 will have target material deposited thereon, such as substrate 131 and shield 140. In addition, surfaces not directly in line-of-sight of target face 119 may also undergo PVD deposition due to "re-sputtering" of material from surfaces such as shield face 141. In this way, target sidewall 115 also has material from target 111 deposited thereon although not in line-of-sight of target face 119. In either case, adhesion between a surface, e.g., shield face 141 or target sidewall 115, and the layer of deposited PVD material must be maximized. The presence of any contaminant on such surfaces, for example from void bursting, substantially reduces the adhesion between said surfaces and the deposited material, thereby producing substrate-contaminating particles.

The inventors have discovered another problem associated with the bonding layer 113, which is arcing between target 111 and shield face 141. The presence of a sharp point or feature on the surface of a charged conductor results in a relatively intense electric field. In the case of target 111, which is maintained at a high voltage during the PVD process, this may result in arcing between the sharp feature on target 111 and shield face 141, which is typically grounded. When a bonding layer 113 is used to mount target 111 to backing plate 112, it is difficult to provide a smooth transition surface between target 111 and backing plate 112 and, hence, may include arc-inducing features.

For example, void bursting from bonding layer 113 may form a sharp point near shield face 141. FIG. 2B is a partial cross-sectional view of the region indicated in FIG. 1 of PVD chamber 100 after void 117 (shown in FIG. 2A) has burst into processing region 160. A gap 117A is formed thereby between target 111 and backing plate 112, creating a sharp point 116 proximate shield face 141, which encourages arcing. When bonding layer 113 is a solder bond, arcing may be caused by rugosities in the surface of the solder bond. Arcing may also be caused by regions of incomplete solder coverage between target 111 and backing plate 112, which may form a gap similar to gap 117A and a sharp point 116.

Therefore, there is a need for an improved PVD target and method of operating the same.

SUMMARY OF THE INVENTION

Embodiments of the present invention generally relate to an apparatus for PVD and particularly to a PVD target assembly. In one embodiment, a PVD target assembly comprises a backing plate, a target with a sealing member disposed on a first surface, and a bonding layer disposed between the backing plate and a second surface of the target. The target may further comprise a side surface exposed to atmosphere with an electrical power connection disposed thereon. The target assembly may further comprise a backing plate extension member, a second target with a second sealing member disposed on a surface thereof, and a bonding layer disposed between the backing plate and a surface of the target on which the sealing member is not disposed.

According to a second embodiment, a PVD target assembly comprises a first target and a second target, each of which is bonded to a respective backing plate with a bonding layer. Each target has a sealing member receiving area on a surface oriented away from its respective backing plate. The target assembly further comprises a target support member having a sealing member receiving area proximate the sealing member receiving area of the first target and the sealing member receiving area of the second target.

According to a third embodiment, a method comprises providing a target having a first face and a second face, positioning a substrate proximate and substantially parallel to the first face, sealing an edge portion of the first face of the target, coupling a backing plate to the second face of the target with a bonding layer, flowing a process gas into a processing region defined between the first face of the target and the substrate, and generating a plasma in the processing region to sputter the first surface of the target to deposit a layer on the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5A illustrates a schematic plan view of a PVD chamber according to one embodiment of the invention and having a multi-piece target.

For clarity, identical reference numerals have been used, where applicable, to designate identical elements that are common between figures.

DETAILED DESCRIPTION

Figure 1:
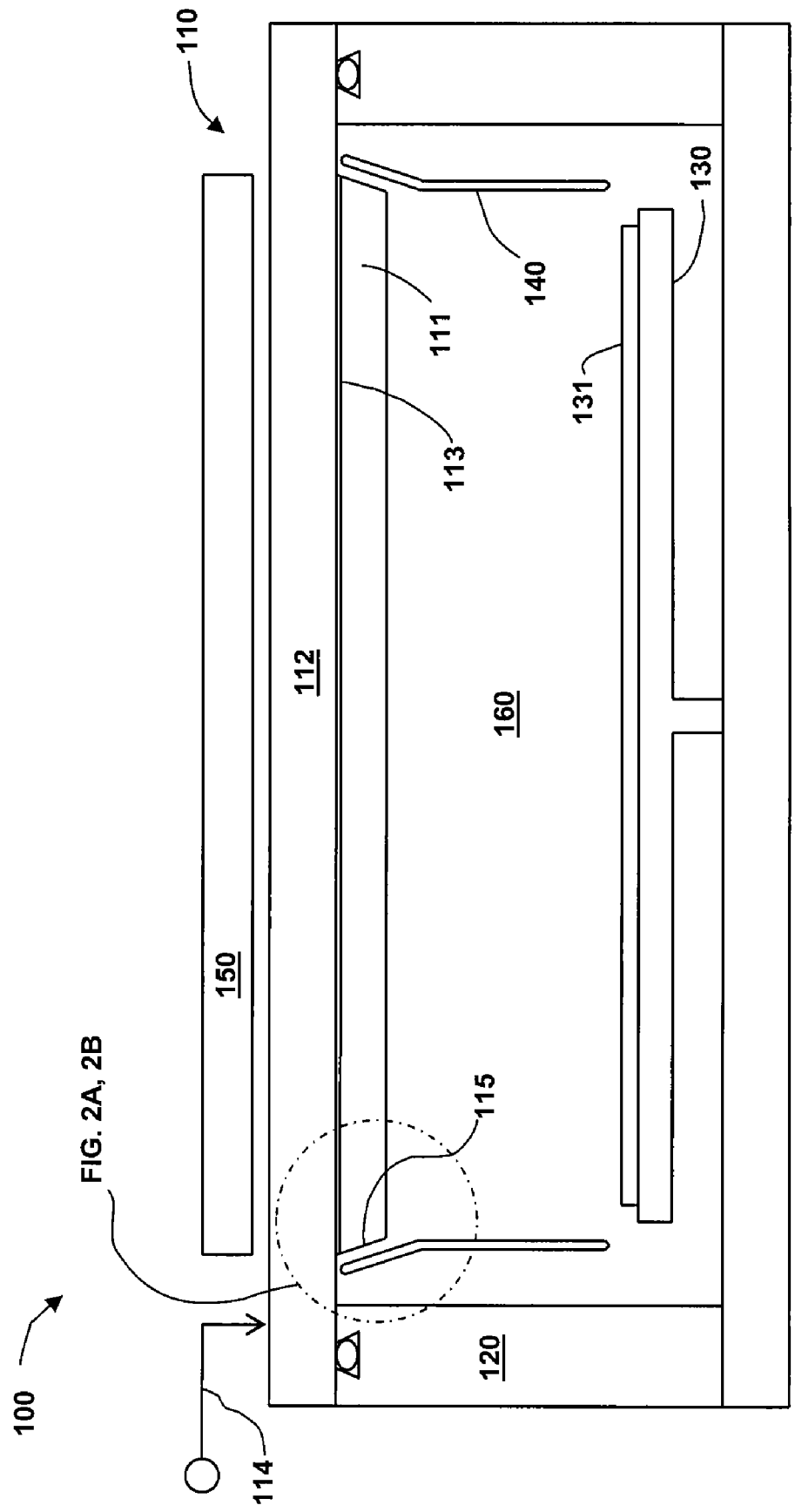
FIG. 1 (Prior Art) illustrates a conventional PVD chamber in a schematic cross-sectional view.
Figure 2B:
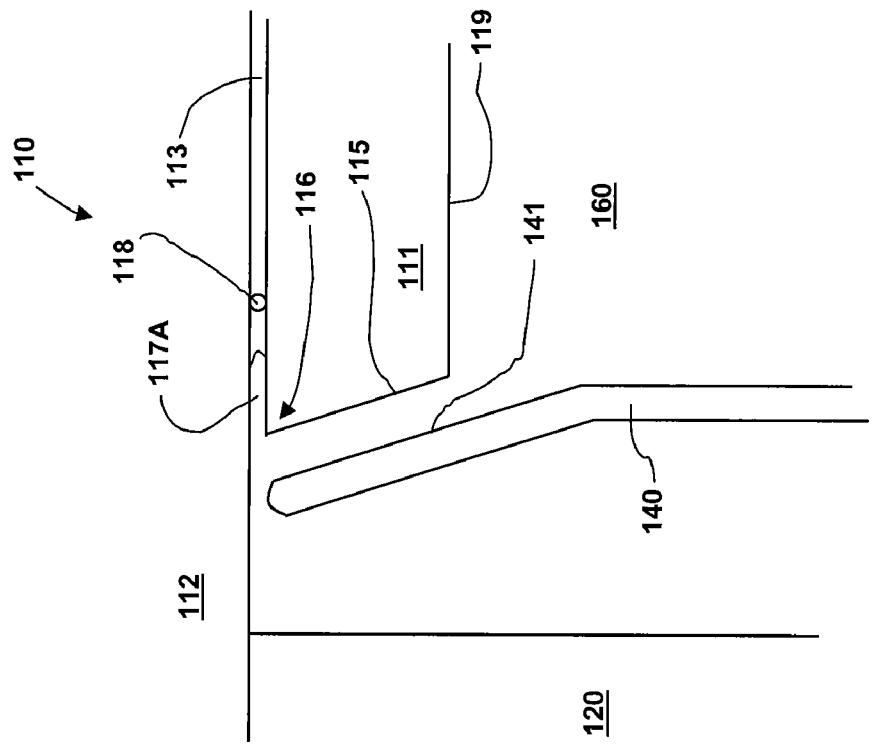
FIGS. 2A, 2B (Prior Art) are partial cross-sectional views of a region indicated in FIG. 1 of a PVD chamber.
Figure 2A:
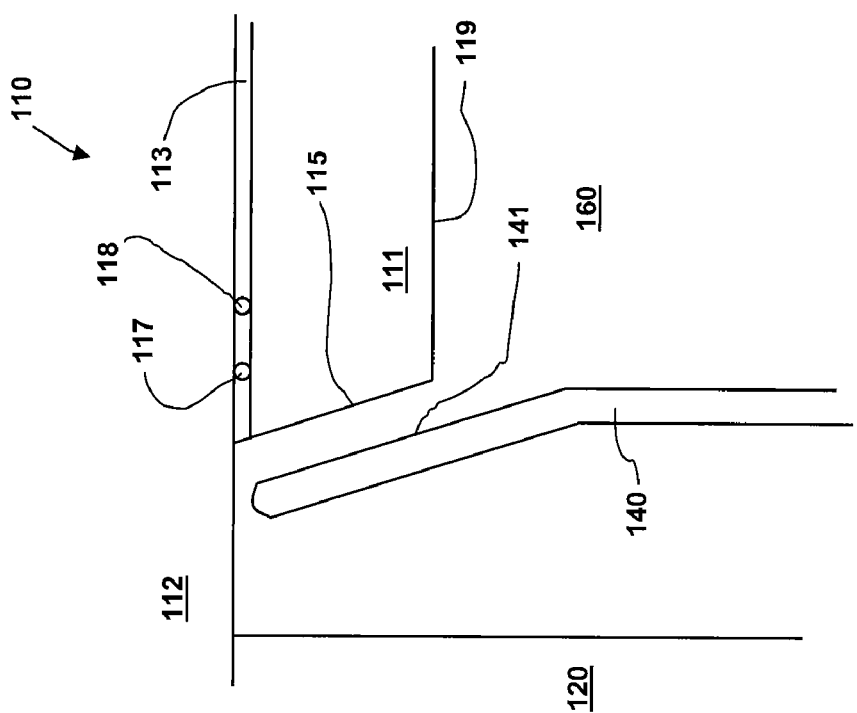
Figure 3:
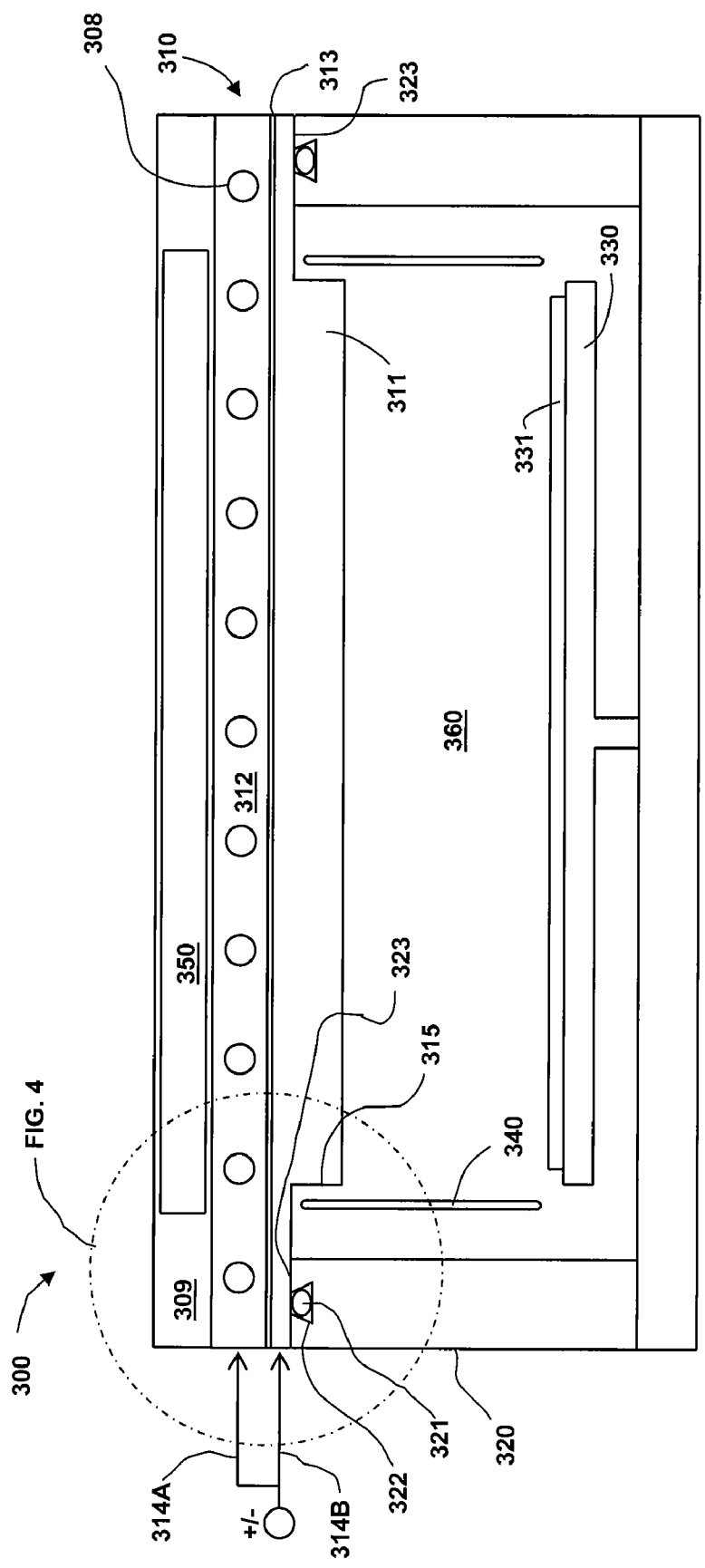
FIG. 3 is a schematic cross-sectional view of a PVD chamber according to one embodiment of the invention.

FIG. 3 is a schematic cross-sectional view of a PVD chamber 300 according to one embodiment of the invention. PVD chamber 300 may include a target assembly 310, a chamber body 320, a substrate support 330, a shield 340, and a processing region 360.

Target assembly 310 includes a magnet assembly 350, which is housed in a magnetron chamber 309, and a target 311, which is bonded to a backing plate 312 by a bonding layer 313. Magnet assembly 350 may be an array of a plurality of magnets that rotates or linearly translates parallel to target 311 in order improve deposition rate and uniformity of a PVD-deposited film on substrate 331. Magnetron chamber 309 may be at atmospheric pressure, evacuated to a pressure below atmospheric pressure, or filled with an electrically insulative cooling fluid, such as deionized water. Power is provided to target 311 via an electrical connection. In one aspect, an electrical connection 314A may be electrically coupled to backing plate 312 to energize target 311. In another aspect, an electrical connection 314B may be electrically coupled to target 311 directly. Power may be DC, AC, or pulsed power. Target 311 consists of the material, typically in a highly purified state, that is to be deposited on substrate 331 in PVD chamber 300. Bonding layer 313 may be an elastomeric bond or a metallic adhesive bond, such as an indium-containing bonding layer. In the latter case, a surface of a target and a surface of a backing plate are deposited with an indium-based coating, also referred to as indium solder, and pressed together at an elevated temperature. Upon cooling, the indium-containing layer solidifies and bonds the target 311 to the backing plate 312.

In one configuration, wherein power is provided to target 311 by electrical connection 314A and bonding layer 313 is an elastomeric bonding material, bonding layer 313 may contain an additional conductive member (not shown for clarity), such as a copper mesh, to provide improved electric contact between the backing plate and the target. In a preferred embodiment, however, target 311 is energized directly via electrical connection 314B in order to obviate the need for energizing target 311 indirectly via backing plate 312 and bonding layer 313.

Substrate support 330 is disposed inside PVD chamber 300 and positions a substrate 331 adjacent the processing region 360 of PVD chamber 300 during PVD processing. Shield 340, also referred to as a dark space shield, may be mounted inside PVD chamber 300 and proximate target sidewall 315 to protect the inner surfaces of body 320 and target sidewall 315 from unwanted deposition during PVD processing and/or to provide an electrically grounded anode region. Processing region 360 is the region in PVD chamber 300 that includes the volume bounded by substrate support 330, target 311, and shield 340.

Target assembly 310 is sealably mounted on upper surface 323 of body 320 in a vacuum-tight manner. By mounting target assembly 310 via a sealable mount on upper surface 323, target assembly 310 may be removed for repair or replacement with minimal disassembly of PVD chamber 300. The vacuum-tight seal is typically formed by means of a sealing member 321, such as an O-ring, positioned in or against sealing surface 322, such as an O-ring groove. FIG. 3 depicts sealing surface 322 as an O-ring groove formed as a feature of upper surface 323 of body 320. In an alternative configuration, sealing surface 322 may instead be a feature on the corresponding surface of target 311. In either case, a vacuum-tight seal is formed between upper surface 323 and target 311. In this way, backing plate 312 is not used to form the vacuum-tight seal between target assembly 310 and body 320, thereby eliminating the need for exposing bonding layer 313 to the processing region 360. Hence, target assembly 310 is configured so that the only surfaces thereof that are exposed to processing region 360 are surfaces of target 311.

Alternatively, aspects of the invention contemplate configurations of sealably mounting target assembly 310 on upper surface 323 wherein sealing member 321 is not an O-ring and sealing surface 322 is not an O-ring groove. For example, target 311 may be sealably mounted to upper surface 323 using an all-metal vacuum seal, wherein sealing member 321 may be a metal gasket, such as a copper strip, compressed against sealing surface 322, which is a stainless steel knife-edge seat. In another example, sealing member 321 may be a polymeric seal, such as a gasket-like G-10 material.

Figure 4:
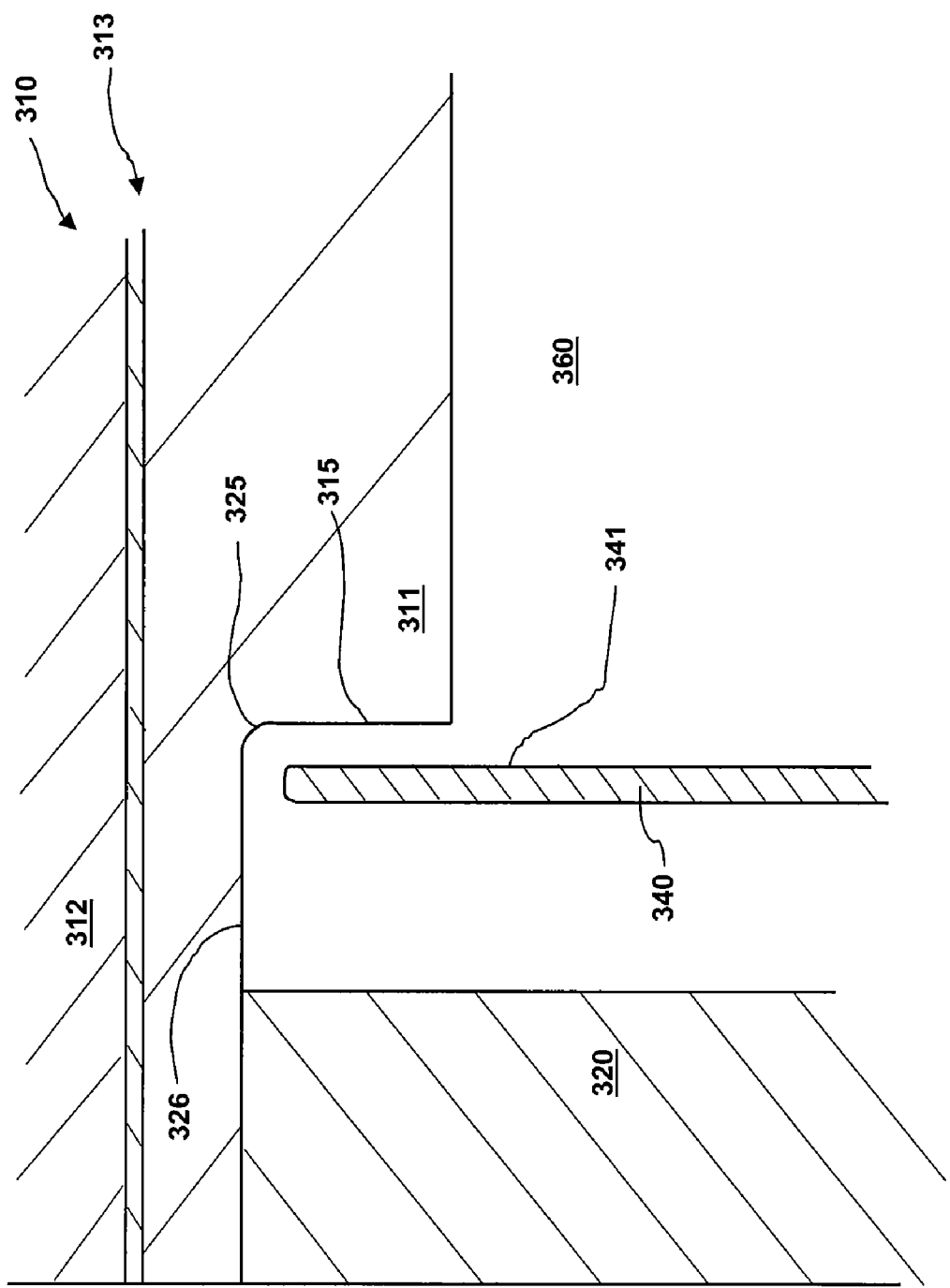
FIG. 4 is a partial cross-sectional view of the region indicated in FIG. 3 of a PVD chamber.

In one configuration, target 311 is fabricated from a single piece of material. In this way the only surface of target 311 in fluid contact with processing region 360 is a single machined surface, i.e., there is no transition between two or more materials to create sharp, arc-inducing features. FIG. 4 is a partial cross-sectional view of the region indicated in FIG. 3 of PVD chamber 300. Because backing plate 312 and bonding layer 313 are not exposed to process region 360, there is no abrupt transition between target material, bonding layer, or backing plate material. Instead, a smoothly machined radius 325 or other appropriate transition may be implemented between target sidewall 315 and target surface 326, thereby minimizing the possibility of arcing between target sidewall 315 and shield face 341. And because bonding layer 313 is not exposed to process region 360, there is no potential for bonding layer material to contaminate said region.

Aspects of the invention further contemplate the use of a direct electrical connection 314B (see FIG. 3) for energizing target 311 during processing. Because a side surface of target 311 is exposed to atmosphere, power may be provided directly to target 311 without being routed through backing plate 312 and bonding layer 313, reducing electrical resistance of the DC circuit.

In one aspect of the invention, backing plate 312 contains a plurality of cooling conduits 308 through which a cooling fluid may be flowed to prevent overheating of target 311 and backing plate 312 during processing.

Figure 5B:
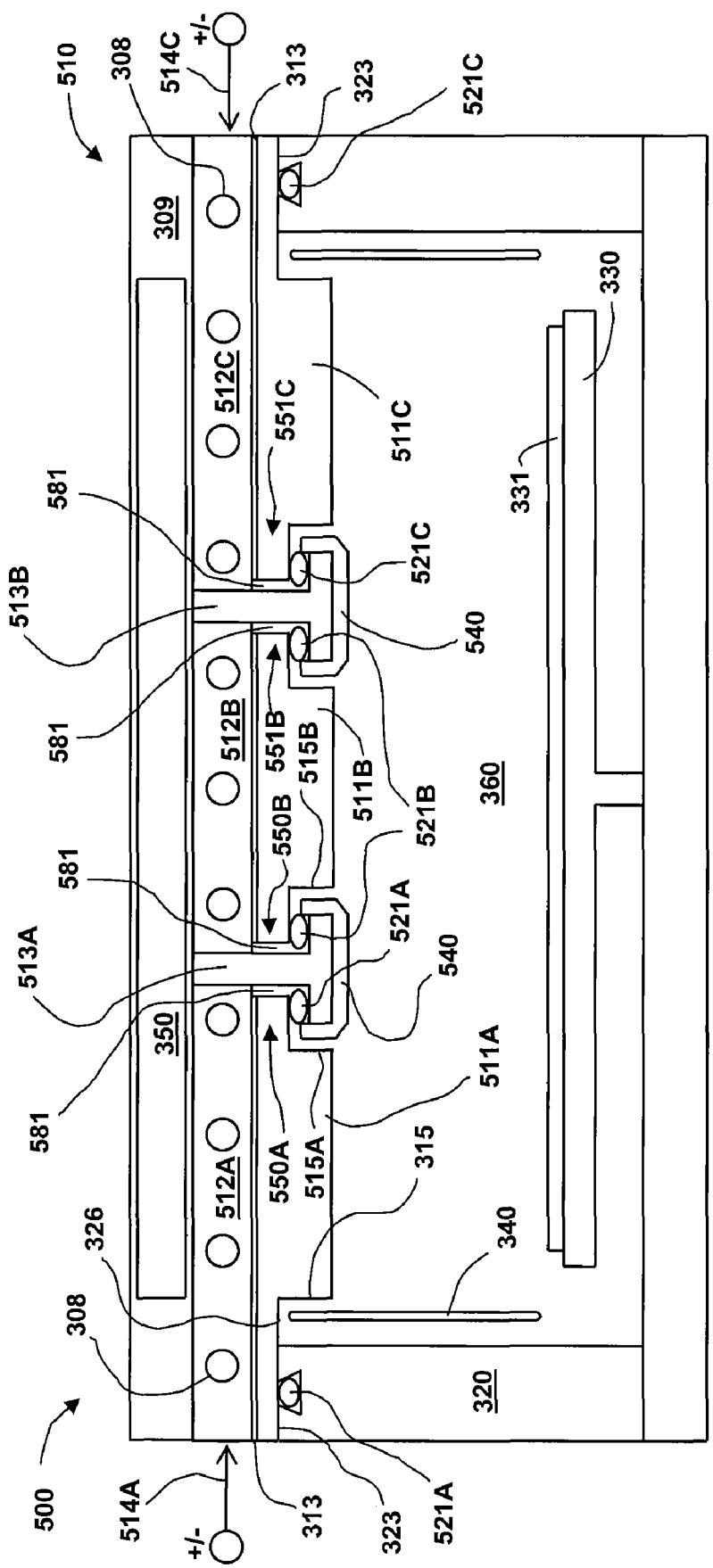
FIG. 5B illustrates a schematic cross-sectional view of a PVD chamber according to one embodiment of the invention and having a multi-piece target.

Aspects of the invention may likewise be used to advantage for a PVD chamber whose target assembly includes a multi-piece target. FIG. 5A illustrates a schematic plan view of a PVD chamber 500 according to one embodiment of the invention and having a multi-piece target. In this aspect, PVD chamber 500 includes a multi-piece target assembly 510 having three targets 511A, 511B, 511C, however aspects of the invention may be beneficially applied to multi-piece target assemblies having two, three, or more targets. For clarity, only multi-piece target assembly 510 and targets 511A, 511B, 511C are shown in FIG. 5A. FIG. 5B illustrates a schematic cross-sectional view at section A-A in FIG. 5A of PVD chamber 500. Referring to FIG. 5B, PVD chamber 500 is substantially similar in organization to PVD chamber 300, described above in conjunction with FIGS. 3 and 4. In addition to the multi-piece target, differences therebetween include multiple backing plates 512A-C, target support members 513A, 513B, center shields 540, and sealing members 521A-C.

In the configuration illustrated in FIG. 5B, each of targets 511A-C is mounted to a separate backing plate, i.e., backing plates 512A-C, respectively. Target support member 513A supports the interior sidewalls 550A, 550B, of targets 511A, 511B, respectively. Similarly, target support member 513B supports the interior sidewalls 551B, 551C, of targets 511B, 511C, respectively. Target support members 513A, B may be structurally coupled to chamber walls 527, 528. Chamber walls 527, 528 are shown in FIG. 5A. Backing plates 512A-C may be supported by chamber walls 527, 528, or by body 320 and target support members 513A, B, and/or a combination of both, depending on the structural requirements of the chamber. Targets 511A-C are each energized via electrical connections 514A-C, respectively, as shown in FIG. 5A.

Referring to FIG. 5B, target support members 513A, B allow a seal to be formed peripherally around each of targets 511A-C, even though each of targets 511A-C, has one or more sides that is not supported by an upper surface 323 of body 320. Interior sidewall 550A of target 511A, interior sidewalls 550B and 551B of target 511B, and interior sidewall 551C of target 511C are not supported by body 320. But a multi-target chamber configured with target support members 513A, B may have a sealing member positioned peripherally against a surface of each target 511A-C, circumscribing each target with an unbroken seal or closure. For example, a portion of the peripheral seal circumscribing target 511A is formed by sealing member 521A between target support member 513A and a surface of interior edge 550A. The remainder of this seal is formed by sealing member 521A between upper surface 323 and target surface 326 of target 511A. In a similar manner, sealing member 521C forms a peripheral vacuum-tight seal against target 511C. In the case of target 511B, two portions of the peripheral seal circumscribing target 511B are formed by sealing member 521B between a surface of an interior edge and a surface of a target support member.

The peripheral seal formed around each of targets 511A-C may be a vacuum-tight seal, for example the portions of the seal formed between upper surface 323 and target surface 326, preventing leakage from atmosphere into processing region 360. Other portions of said seals may not be vacuum-tight seals, for example when the volumes on each side of the seal are at vacuum. This may be the case when regions 581 are evacuated regions and the seals between regions 581 and processing region 360 are only required to prevent contamination from entering processing region 360. It is important to note that the peripheral seal formed by sealing members 521A-C against targets 511A-C, respectively, isolates bonding layer 313 from processing region 360. This configuration eliminates contamination of processing region 360 from bonding layer 313 as well as arcing due to sharp points and/or rugosities associated with bonding layer 313.

Center shield 540 protects surfaces from unwanted deposition, for example target center sidewalls 515A, 515B and target support members 513A, B. As described above for target 311 in conjunction with FIG. 4, targets 511A-C may each be fabricated from a single piece of material, removing the abrupt transition between bonding layer, target, and backing plate from the processing region.

For a multi-target configuration, the inventors have learned that a normal orientation of the target sidewall minimizes deposition thereon and reduces subsequent particle contamination of substrates. Therefore, in one aspect, one or more sidewalls of targets 511A, 511B, such as interior sidewalls 550A, 551B, respectively, are oriented substantially normal to the surface of substrate support 330.

The inventors have also learned that aspects of the invention may be used to advantage for PVD chambers adapted to process large-area substrates. Processing large-area substrates requires larger PVD target assemblies. Larger PVD target assemblies are more likely to benefit from the structural rigidity provided by a backing plate bonded to the target, and therefore may benefit from aspects of the invention. In addition, large-area substrates may require multi-piece target assemblies, which may also benefit from aspects of the invention.

Substrates of the invention can be of any shape (e.g., circular, square, rectangle, polygonal, etc.) and size. Also, the type of substrate is not limiting and can be any substrate comprised of a material of silicon, carbon-containing polymer, composite, metal, plastic, or glass.

While the foregoing is directed to embodiments of the present invention, other and further embodiments of the invention may be devised without departing from the basic scope thereof, and the scope thereof is determined by the claims that follow.

What is claimed is:

1. A physical vapor deposition apparatus, comprising:
a chamber body having chamber walls and a magnetron assembly disposed over the chamber body;
a first target disposed below the magnetron assembly, the first target having:
a first surface;
a bonding layer disposed on a second surface;
a side surface, wherein the side surface is exposed to atmosphere; and
an electrical power connection disposed on the side surface of the first target;
a first backing plate coupled to the second surface;
a second target disposed below the magnetron assembly, the second target having:
a third surface;
a bonding layer disposed on a fourth surface;
a side surface, wherein the side surface is exposed to atmosphere; and
an electrical power connection disposed on the side surface of the second target;
a second backing plate coupled to the fourth surface;
a target support member having a sealing member receiving area proximate a sealing member receiving area of the first target and a sealing member receiving area of the second target; and
a shield disposed proximate to a processing region within the chamber body, the side surface of the first target and the side surface of the second target extending towards the chamber walls to positions beyond the shield, the first surface of the first target and the third surface of the second target extending to positions below an upper portion of the shield.

2. The apparatus of claim 1, wherein a sealing member forms a first peripheral seal around the first target and a second sealing member forms a second peripheral vacuum-tight seal around the second target.

3. The apparatus of claim 2, wherein a portion of the first peripheral seal is formed between the target support member and the first target by the sealing member, and wherein a portion of the second peripheral seal is formed between the target support member and the second target by the second sealing member.

4. The apparatus of claim 1, wherein a sidewall of the first target is oriented substantially normal to a substrate support surface.

* * * * *